March 8, 1966 A. J. SADLER 3,239,392
MANUFACTURE OF SILICON CONTROLLED RECTIFIERS
Filed Aug. 12, 1963
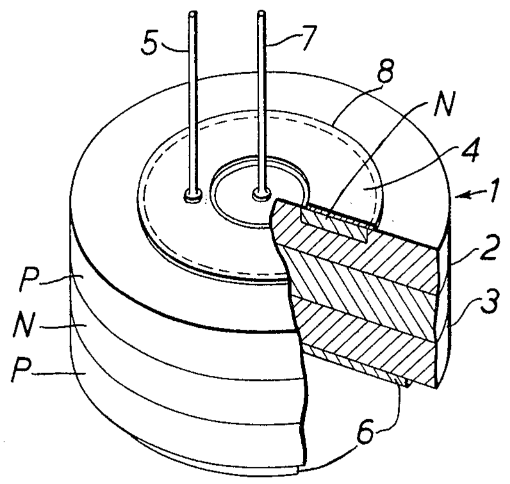

United States Patent Office 3,239,392

Patented Mar. 8, 1966

3,239,392

MANUFACTURE OF SILICON CONTROLLED RECTIFIERS

Albert John Sadler, Rugby, England, assignor to Associated Electrical Industries Limited, London, England, a British company Filed Aug. 12, 1963, Ser. No. 301,572
Claims priority, application Great Britain, Aug. 15, 1962, 31,324/62
3 Claims. (Cl. 148—177)

This invention relates to the manufacture of controlled rectifiers which employ a silicon element having four regions, two of which are of N-type and two of P-type conductivity therein, said regions being arranged alternately to provide three P-N junctions between them.

It is well-known that certain operating characteristics are improved if at least part of the junction between the region, which serves as the emitter, and the adjacent region of opposite conductivity type, is short-circuited. The region which serves as the emitter is usually located at one face of the element and is surrounded by the adjacent region of opposite conductivity type. A metallic layer is conveniently deposited on to the surface of this face of the element in ohmic contact with both the emitter region and the adjacent region to provide the short-circuit.

A suitable material to form the metallic layer is aluminium, but difficulties arise if it is necessary to solder a conducting terminal member to the aluminium layer. Gold is a more suitable material to form this layer, since conducting terminal members can readily be soldered thereto, but difficulties arise in applying this material to the element. If the gold is applied to the element in the form of a foil, and is then heated to the temperature at which it melts, it is likely that the impurity activating material in the region of the element which serves as the emitter would diffuse into the gold during the heating period and eventually find its way into, and contaminate, the adjacent region of opposite conductivity type.

It is an object of the present invention to provide a method of forming the short-circuit on a silicon controlled rectifier which overcomes this difficulty.

According to the invention, a method of forming a short-circuit between the region of a silicon controlled rectifier element which is to serve as the emitter and the adjacent region thereof of opposite conductivity type, comprises the steps of depositing gold in finely divided form on to a surface of the element in vacuum to form a layer in contact with both of said regions after the element has been heated to a temperature sufficient to cause the gold to form a eutectic with the silicon when it comes into contact therewith, and then cooling the element sufficiently quickly for the gold to solidify before impurity activating material present in the region which is to serve as the emitter enters into the gold.

The gold is preferably evaporated on to the surface of the silicon, and it liquifies immediately to form a eutectic with the silicon. However, snice the material is allowed to cool as soon as the evaporation process is applied, the gold quickly solidifies and is in molten form for only a matter of seconds and this is an insufficient period of time for any significant quantity of the impurity activating material in the region to be carried into the gold.

In order that the invention may be more readily understood, it will be described by way of example with reference to the accompanying drawing, which shows in perspective view a semi-conductor controlled rectifier in accordance with one embodiment of the invention.

Reference numeral 1 indicates a body of silicon having three regions of P or N type conductivity formed therein and arranged alternately to form two P-N junctions 2 and 3 between them. The fourth region 4 of generally annular form is located in the surface of one end region of the body and the region serves as the emitter of the element.

In accordance with the invention, a short-circuit is provided between at least part of the outer junction between the annular emitter region 4 and the region adjacent thereto. The short-circuit is formed by heating the element to a temperature of between 400 to 650° C. in vacuum and evaporating gold on to the surface of the element to form an annular layer which overlaps the adjacent peripheries of the region 4 and the region adjacent thereto.

Immediately the gold is deposited on to the element it forms a eutectic with the silicon, and the temperature of the element is then allowed to fall, and in this way the gold which immediately liquified on being deposited on the heated silicon quickly solidifies and forms a short-circuit layer 8. The process of evaporating gold on to the heated semi-conductor element can be completed within a few seconds, and the temperature of the element can be reduced sufficiently quickly to cause the gold to solidify and thus prevent the impurity activating material in the region 4 which serves as the emitter from entering into the gold and being carried into the adjacent region.

The electrode 5 is secured to the layer 8 in ohmic contact therewith to form the connection to the emitter region. A base contact 6 is provided on the outer surface of the other end region of the body, and a trigger electrode 7, to which a potential may be applied to switch the element from an insulating to a conducting state, is located within the annular emitter region, but in ohmic contact with the region which is adjacent thereto and has opposite conductivity characteristics.

What I claim is:

1. In the manufacture of a silicon controlled rectifier comprising a body of silicon having four regions therein, two of N-type conductivity and two of P-type conductivity arranged alternately to provide three P-N junctions between them, the formation of a contact layer to which an electrode may be attached, said layer also forming a short-circuit between the region which is to serve as the emitter and the region adjacent thereto, by heating the silicon to a temperature between 400° and 650° C., at which gold forms a eutectic therewith, depositing gold in finely divided form onto a surface of the body so as to form a molten layer thereon which overlaps part of the junction between said emitter region and the region adjacent thereto, and quickly solidifying the molten layer before impurity material present in the region which is to serve as the emitter enters into said layer.

2. In the manufacture of a silicon controlled rectifier comprising a body of silicon having four regions therein, two of N-type conductivity and two of P-type conductivity arranged alternately to provide three P-N junctions between them with the region which is to serve as the emitter surrounded by the region adjacent thereto, the formation of a contact layer to which an electrode may be attached, said layer also forming a short-circuit between said emitter region and the region adjacent thereto, by heating the silicon to a temperature between 400° and 650° C., at which gold forms a eutectic therewith, depositing gold in finely divided form onto a surface of the body so as to form an annular molten layer thereon which overlaps part of the junction between said emitter region and the region adjacent thereto, and quickly solidifying the molten layer before impurity material present in the region which is to serve as the emitter enters into said layer.

3. In the manufacture of a silicon controlled rectifier comprising a body of silicon having four regions therein, two of N-type conductivity and two of P-type conductivity arranged alternately to provide three P-N junctions between them, the formation of a contact layer to which an electrode may be attached, said layer also forming a short-circuit between the region which is to serve as the emitter and the region adjacent thereto, by heating the silicon to a temperature of between 400° and 650° C., evaporating elemental gold in finely divided form onto a surface of the body in vacuum so as to form a molten layer thereon which overlaps part of the junction between said emitter region and the region adjacent thereto and quickly solidifying the molten layer before impurity material present in the region which is to serve as the emitter enters into said layer.

References Cited by the Examiner

UNITED STATES PATENTS

| | | | |
|---|---|---|---|
| 2,937,113 | 5/1960 | Herbert et al. | 148—185 |
| 2,966,434 | 12/1960 | Hibberd | 148—177 |
| 2,998,334 | 8/1961 | Bakalar et al. | 148—185 |
| 3,060,018 | 10/1962 | Desmond | 148—185 |
| 3,082,127 | 3/1963 | Lee et al. | 148—185 |

DAVID L. RECK, *Primary Examiner.*

HYLAND BIZOT, *Examiner.*

R. O. DEAN, *Assistant Examiner.*